US007096410B2

(12) United States Patent
Nagase et al.

(10) Patent No.: US 7,096,410 B2
(45) Date of Patent: Aug. 22, 2006

(54) TURBO-CODE DECODING USING VARIABLY SET LEARNING INTERVAL AND SLIDING WINDOW

(75) Inventors: Taku Nagase, Tokyo (JP); Noboru Oki, Saitama (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 49 days.

(21) Appl. No.: 10/508,470

(22) PCT Filed: Jan. 22, 2004

(86) PCT No.: PCT/JP2004/000533

§ 371 (c)(1),
(2), (4) Date: Sep. 21, 2004

(87) PCT Pub. No.: WO2004/066506

PCT Pub. Date: Aug. 5, 2004

(65) Prior Publication Data

US 2005/0172200 A1   Aug. 4, 2005

(30) Foreign Application Priority Data

Jan. 23, 2003   (JP) .............................. 2003-015286

(51) Int. Cl.
    *H03M 13/03* (2006.01)
(52) U.S. Cl. ...................... 714/790; 714/774
(58) Field of Classification Search ................ 714/755, 714/792, 790, 774
    See application file for complete search history.

(56) References Cited

U.S. PATENT DOCUMENTS

| 5,978,365 | A | * | 11/1999 | Yi ............................... 370/331 |
| 6,014,411 | A | * | 1/2000 | Wang ......................... 375/259 |
| 6,307,901 | B1 | * | 10/2001 | Yu et al. ..................... 375/341 |
| 6,484,285 | B1 | * | 11/2002 | Dent .......................... 714/791 |
| 6,829,313 | B1 | * | 12/2004 | Xu .............................. 375/341 |
| 6,901,117 | B1 | * | 5/2005 | Classon et al. ............. 375/341 |
| 2003/0126538 | A1 | * | 7/2003 | Mejean et al. .............. 714/755 |
| 2003/0161062 | A1 | * | 8/2003 | Akamatsu .................... 360/39 |

FOREIGN PATENT DOCUMENTS

WO    WO 01/54286    7/2001

* cited by examiner

*Primary Examiner*—Guy Lamarre
*Assistant Examiner*—Mujtaba K. Chaudry
(74) *Attorney, Agent, or Firm*—Frommer Lawrence & Haug LLP; William S. Frommer

(57) ABSTRACT

A data reception device is provided with: a puncture rate detection element to detect the puncture rate of received data, an interpolation element to interpolate bits decimated at the detected puncture rate, a deinterleaving element to restore interleaved data to the original arrangement, and a turbo-decoding element, while variably setting the length of the learning interval according to the puncture rate detected by the puncture rate detection element, to input sliding window data and the data of the above learning interval following the data of the sliding window to the data processed by the interpolation element and deinterleaving element, and to perform recursive operations to decode the data of the sliding window. The valid received signal contained in the learning interval can be maintained approximately constant even if the puncture rate changes.

4 Claims, 5 Drawing Sheets

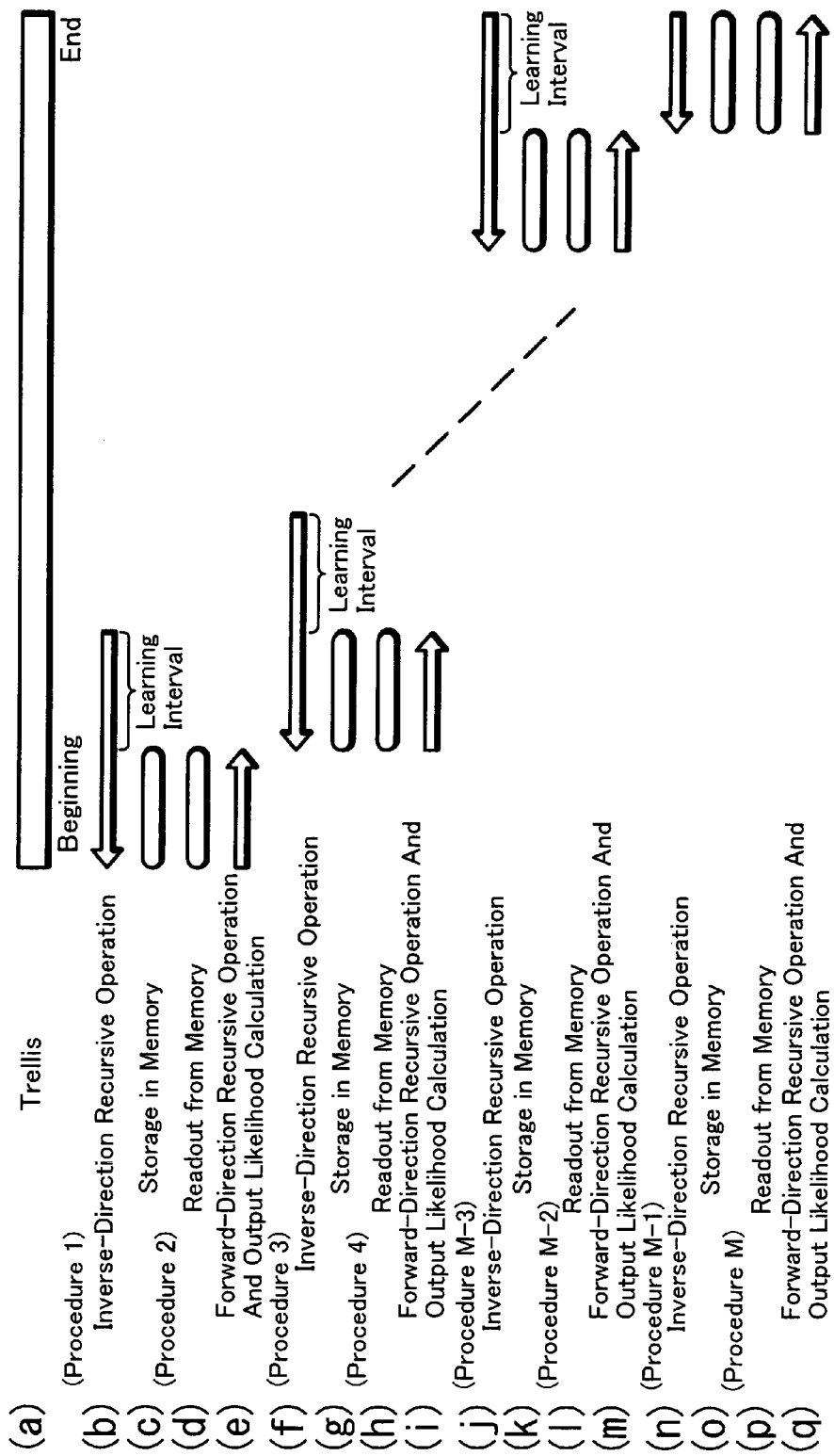

TURBO-CODE DECODING USING VARIABLY SET LEARNING INTERVAL AND SLIDING WINDOW

TECHNICAL FIELD

This invention relates to a data reception method and device for receiving transmitted data that is encoded to be a turbo-code in which a convolution code and interleave processing are combined.

BACKGROUND ART

In prior art, encoding into what are called turbo-codes has been performed to efficiently transmit data. FIG. 1 shows one example of the configuration of a turbo-encoder which performs turbo-encoding on the transmission side. The input data is supplied as systematic bits to a parallel/serial converter 11, and are supplied to a first convolutional encoder 20, as well as to a second convolutional encoder 30 through an interleaver 12. The first convolutional encoder 20 uses adders 21 and 25, and D flip-flops 22, 23, and 24 to perform convolution processing to generate parity bits a, and the generated parity bits a are supplied to the parallel/serial converter 11. The second convolutional encoder 30 uses adders 31 and 35, and D flip-flops 32, 33, and 34 to perform convolution processing to generate parity bits b, and the generated parity bits b are supplied to the parallel/serial converter 11.

The parallel/serial converter 11 converts the supplied systematic bits and parity bits a and b into serial data in a predetermined order, and outputs the result as turbo-encoded data.

On the side receiving a transmitted signal which has been turbo-encoded in this way, decoding is performed using, for example, a turbo-decoder shown in FIG. 2. To explain the configuration of the turbo-decoder shown in FIG. 2, the received signal is supplied to a serial/parallel converter 41, and is separated to be systematic bits and parity bits a and b. Separation by this serial/parallel converter 41 is executed with timing indicated by a timing control circuit 49.

A soft output decoding algorithm unit 42 uses the separated systematic bits, the parity bits a, and the output signal of a memory 46 for deinterleaving to perform decoding processing using a soft output decoding algorithm called a MAP algorithm. Data decoded in the soft output decoding algorithm unit 42 is supplied to a memory 43 for interleaving and is subjected to interleaving processing; and then the interleaved data and parity bits b separated in the serial/parallel converter 41 are supplied to a soft output decoding algorithm unit 44. Decoding processing using the MAP algorithm is also performed by the soft output decoding algorithm unit 44, and the decoded output is supplied, through the deinterleave memory 46, to the soft output decoding algorithm unit 42. Hence the outputs of decoding processing in the soft output decoding algorithm unit 42 and of decoding processing in the soft output decoding algorithm unit 44 are supplied to each other to perform iterative decoding.

Data which has been interleaved in the interleave memory 43 and the decoded output of the soft output decoding algorithm unit 44 are supplied to an adder 45 and added, and the added output is supplied to a hard decision unit 47. The hard decision unit 47 is a circuit which obtains the final decoding result. The result of decision (decoding) in this hard decision unit 47 is supplied to the deinterleave memory 48 and is subjected to deinterleaving, and the deinterleaved data is output as the result of decoding of the turbo-code.

The timing of processing is supplied to each of the soft output decoding algorithm units 42 and 44, and to the interleave memory 43, deinterleave memory 46, and deinterleave memory 48 by the timing control circuit 49.

To explain the decoding processing states of the turbo-decoder shown in FIG. 2, since a turbo-code is a block code, encoding processing and decoding processing are performed in units of blocks including a stipulated number of bits N. These block units are here called code blocks. The required numbers of words held by the interleave memory and deinterleave memory are equal to the number of bits in one code block.

The iterative decoding performed by the two soft output decoding algorithm units 42 and 44 is iterated, for example, from several times to several tens of times. Prior to beginning iterative decoding, the soft output decoding algorithm unit 42 is initialized to an initial value (0). To explain in summary the processing of one cycle of this iterative decoding, in the first half of the first cycle, the soft output decoding algorithm unit 42 operates. The systematic bits, parity bits a, and output of the deinterleave memory 46 are output to the soft output decoding algorithm unit 42. The output of the soft output decoding algorithm unit 42 is accumulated in the interleave memory 43. At the time of the first cycle of iterative processing, no information has yet been accumulated in the deinterleave memory 46, and so the initial value (0) is also used therein.

In the second half of the first cycle, the soft output decoding algorithm unit 44 operates. The parity bits b and output of the interleave memory 43 are supplied to the soft output decoding algorithm unit 44. In this configuration, the systematic bits corresponding to the MAP algorithm b decoded in the soft output decoding algorithm unit 44 are not transmitted, and 0 is input. The decoded output of this soft output decoding algorithm unit 44 is accumulated in the deinterleave memory 46. The above summarizes the first cycle of decoding processing in the iterative decoding processing. Information sent to the soft output decoding algorithm units 44 and 42 from the interleave memory 43 and deinterleave memory 46 is called prior likelihood information.

After this processing cycle is repeated a predetermined number of times, the hard decision result (sign bit) of the output added by the adder 45 is obtained in the hard decision unit 47, this result is supplied to the deinterleave memory 48, and the bit sequence is restored to obtain the final decoding result.

Next, operation of the MAP algorithm used in decoding processing in the soft output decoding algorithm units 42 and 44 is explained, referring to FIG. 3. This MAP algorithm is explained in a paper by L. R. Bahl, J. Cocke, F. Jelinek, and J. Raviv, "Optical Decoding of Linear Codes for Minimizing Symbol Error Rate", IEEE Transactions on Information Theory, Vol. IT-20, March 1974, pp. 284–7.

In a MAP algorithm, soft decision output is obtained for each bit position in a code block. At this time, recursive operations in the forward and inverse directions are necessary to determine the state metric on the trellis. As indicated in FIG. 3, this processing must be executed continuously, in single-block units, from beginning to end. That is, after storing the state metric for each state through recursive operations throughout an N-stage code block, processing must be performed. In order to perform such processing, memory capable of storing large amounts of data is necessary. For example, in the case of processing (code block length N to 5114, number of states M=8) applied to a wireless telephone system called W-CDMA, the required memory capacity is as large as approximately 40 k words.

Therefore, as techniques to reduce the amount of memory required by MAP algorithms, processing using a sliding window has been proposed in reference 1 and reference 2.

[Reference 1] A paper by S. Pietrobon and S. Barbulescu, "A Simplification of the Modified Bahl et al. Decoding Algorithm for Systematic Convolutional Codes", Int. Symp. On Inform. Theory and Its Applications, Sydney, Australia, pp. 1073–7, November 1994, revised Jan. 4, 1996.

[Reference 2] A paper by S. Pietrobon, "Efficient Implementation of Continuous MAP Decoders and a Synchronization Technique for Turbo Decoders", Int. Sym. On Inform Theory and Its Applications, Victoria, B. C., Canada, pp. 586–9, September 1996.

Details of the above-described decoding processing using a sliding window are explained in an embodiment of this invention, however in brief, recursive operations are executed in window units. If the window length is L and the time of a certain window is t, then a inverse-direction recursive operation begins from time t+2L, and the state metric resulting from the inverse-direction recursive operation is stored in memory over the interval from time t+L to time t.

The interval from time t+2L to time t+L is here called a learning interval, because processing is performed to adequately improve the reliability of recursive operations divided in window units. If the length of the learning interval is P, then in the above non-patent reference it is stated that P=L; however this is not necessarily the case. By shortening the length P of the learning interval, increases in the volume of operations can be suppressed, however on the other hand there is degradation of performance; hence the value of P must be decided with care, and it has been necessary to provide a certain margin. Forward-direction recursive operations and output likelihood calculations are executed in the interval from time t to time t+L.

Similar processing is performed for the next window, with the leading position of the window increased by L to t+L. Processing is subsequently continued, increasing (sliding) the leading position of the window by L each time, until the end of the trellis is reached. A learning interval is not provided for recursive operations performed from the end of the trellis.

By performing operations using such a sliding window, the required amount of memory is reduced from N*M words to L*M words. However, with respect to the volume of operations, the volume of inverse-direction recursive operations is increased by a factor of 2.

In this way, the length P of the learning interval is determined taking into account the allowable increase in the volume of operations and the degradation in performance. In order to reduce the volume of operations, the length of the learning interval must be shortened; however, depending on the state of the turbo-codes transmitted, an appropriate learning interval length may not always be set.

The present invention was devised in light of the above considerations, and has as an object of providing a data reception method and device in which, when turbo-codes are received and decoding is performed through operations using a sliding window, the length of the learning interval can be set optimally.

DISCLOSURE OF THE INVENTION

A data reception method of this invention is a method for receiving and decoding turbo-code that is encoded in units of blocks including a predetermined number of bits by a combination of convolutional encoding and interleaving and that is decimated as necessary at a predetermined puncture rate to be transmitted, including: processing to judge the puncture rate of received data; interpolation processing to interpolate decimated bits at the puncture rate; deinterleave processing to restore interleaved data to the original arrangement; and turbo-decoding processing of data subjected to the interpolation processing and to the deinterleave processing, in which, while variably setting the length of the learning interval according to the puncture rate judged in the puncture rate judgment processing, the data of the sliding window and the data of the above learning interval following the data of the sliding window are input to decode the data of the sliding window by recursive operation.

A data reception device of this invention is a data reception device that receives and decodes turbo-code encoded in units of blocks including a predetermined number of bits, including: puncture rate judgment means for detecting the puncture rate of received data; interpolation means for interpolating bits decimated at the judged puncture rate; deinterleaving means for restoring the interleaved data to the original arrangement; and turbo-decoding means, while variably setting the length of the learning interval according to the puncture rate detected by the puncture rate judgment means, to input the data of the sliding window and the data of the above learning interval following the data of the sliding window to the data subjected to the processing in the interpolation means and deinterleaving means, to decode the data of the sliding window by recursive operations.

According to this invention, the length of the learning interval is variably set according to the puncture rate of the received data, so that valid received signals within the learning interval can be kept approximately constant even if the puncture rate changes. Hence as the learning interval, the shortest length can continuously be used, and so there are the advantageous results that during computation of a MAP algorithm using a sliding window there is no longer a need to perform excessive calculations; the speed of calculations can be increased; and wasteful power consumption can be suppressed.

In particular, as the learning interval length set variably according to the puncture rate, the length by an amount equivalent to the number of bits decimated at the puncture rate is changed, so that the number of valid bits of received data contained in the learning interval can be kept approximately constant and efficient decoding becomes possible.

BRIEF DESCRIPTION OF DRAWINGS

FIG. 6 is an explanatory diagram showing the processing procedure of the MAP algorithm using a sliding window according to an embodiment of the present invention.

BEST MODE FOR CARRYING OUT THE INVENTION

Figure 1:
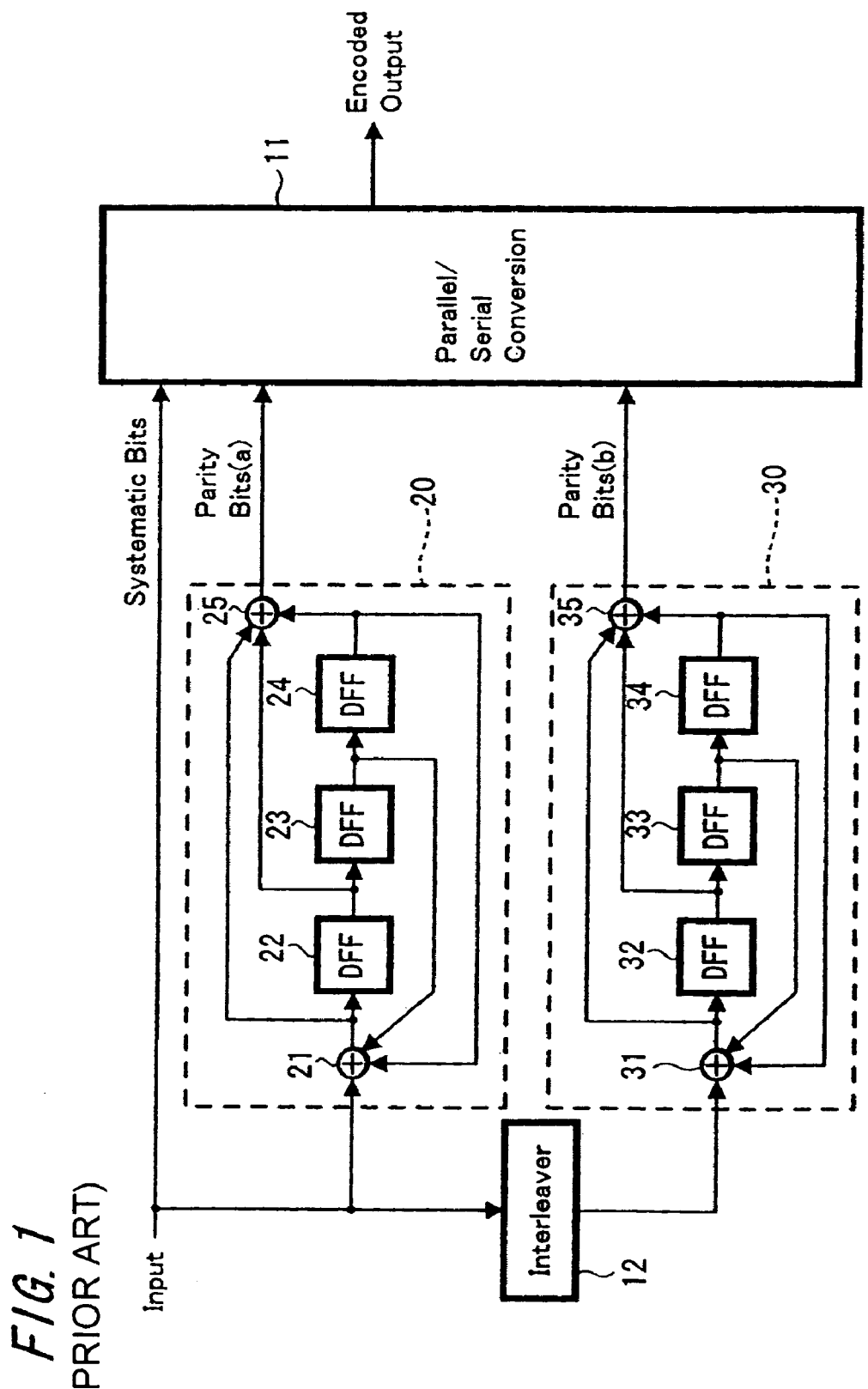
FIG. 1 is a block diagram showing an example of the configuration of a turbo-encoder.
Figure 2:
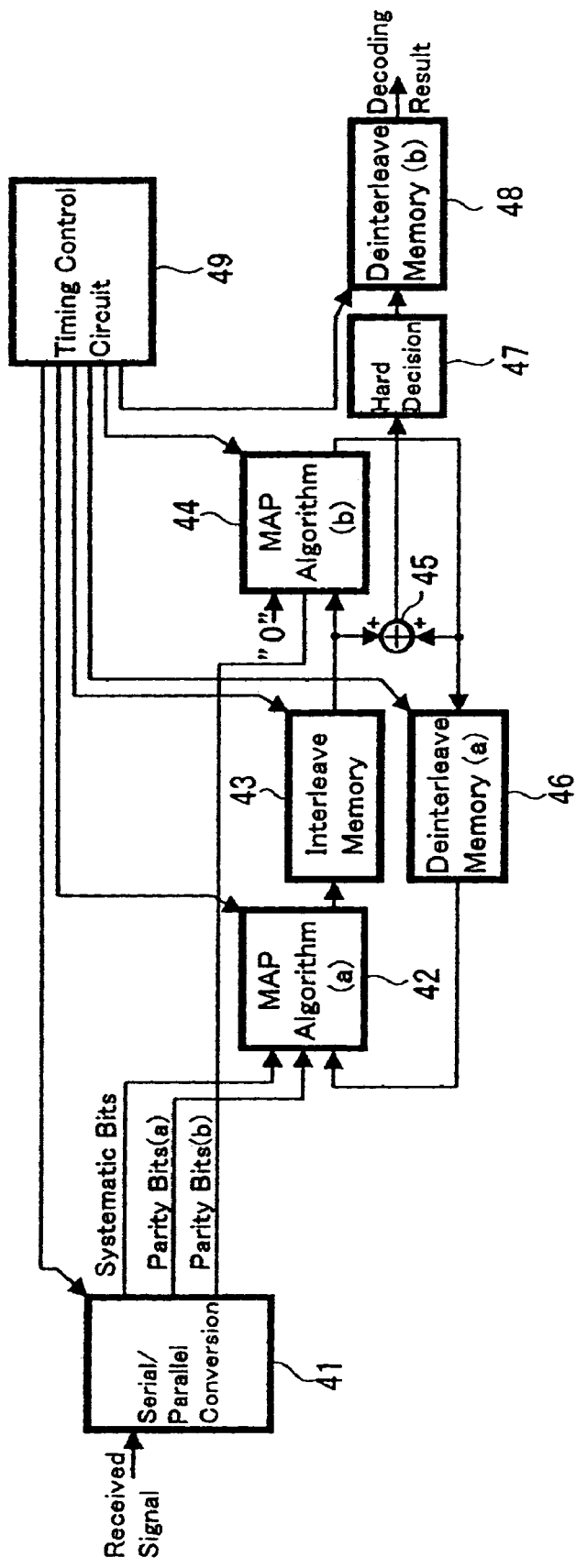
FIG. 2 is a block diagram showing an example of the configuration of a turbo-decoder.
Figure 3:
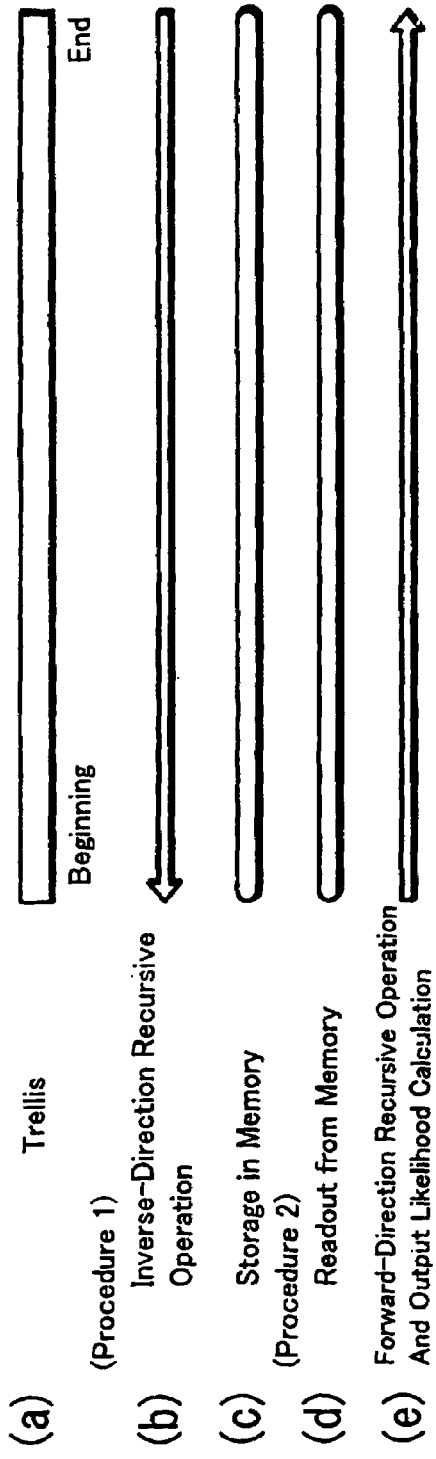
FIG. 3 is an explanatory diagram schematically showing the processing procedure of a conventional MAP algorithm.
Figure 4:
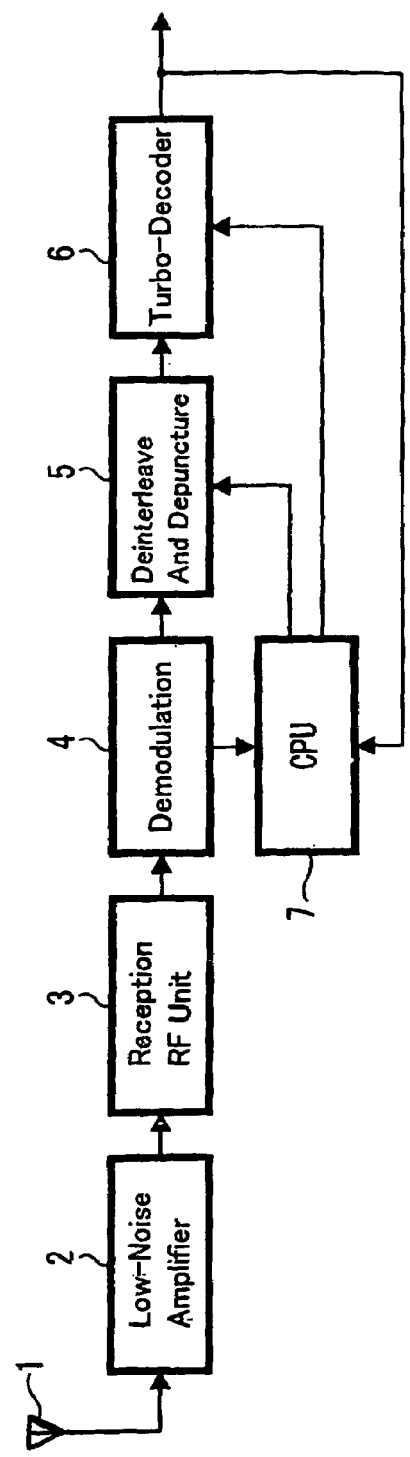
FIG. 4 is a block diagram showing an example of the configuration of the reception device according to an embodiment of the present invention.

Hereinafter, an embodiment of the present invention is explained referring to FIGS. 4 through 6.

In this embodiment, the invention is applied to a reception device which receives data encoded as a turbo-code. FIG. 4 shows the overall configuration of the reception device. Signals received by an antenna 1 are supplied to a low-noise amplifier 2 and amplified. The signals output from the low-noise amplifier 2 are supplied to a reception RF unit 3 and frequency-converted, and then supplied to a demodulator 4. Received signals which have been demodulated in the demodulator 4 are supplied to a deinterleave and depuncture unit 5; deinterleave processing, which is the inverse of the interleave processing performed at the time of transmission, is performed to restore the original data arrangement; and 0 bits are inserted at positions of data decimation at the time of transmission, to perform depuncture processing and restore the original data length.

Data restored to the original data length by depuncture processing is supplied to a turbo-decoder 6 and decoded, to obtain the reception data. Here, the turbo-decoder in this embodiment is configured to perform decoding processing using a sliding window, as described above in the description of the prior art.

Reception processing in the deinterleave and depuncture unit 5, in the turbo-decoder 6 and similar is executed under the control of a central control unit (CPU) 7.

Here, the puncture rate is variably set according to the data and other parameters, and data on the puncture rate is appended to the transmitted data as control data or similar. This puncture rate data and other data necessary for reception control is supplied to the central control unit 7 from the demodulator 4, and the puncture rate can be judged by the central control unit 7 from this data.

In the case of this embodiment, the positions and lengths for insertion of 0 bits are set variable in the deinterleave and depuncture unit 5 according to the puncture rate judged by the central control unit 7, so that cases in which data with any puncture rate is received can be dealt with. Further, when the turbo-decoder 6 performs decoding processing using a sliding window according to the judged puncture rate, the central control unit 7 executes control to variably set the length of the learning interval.

The length of the learning interval set variably according to the puncture rate is changed by a length equivalent to the number of bits decimated at the puncture rate, for example according to the judgment of the puncture rate by the central control unit 7, so that the number of bits of actual data contained in the learning interval (that is, the data excluding the 0 bits inserted in depuncture processing) is constant even if the puncture rate is changed.

Figure 5:
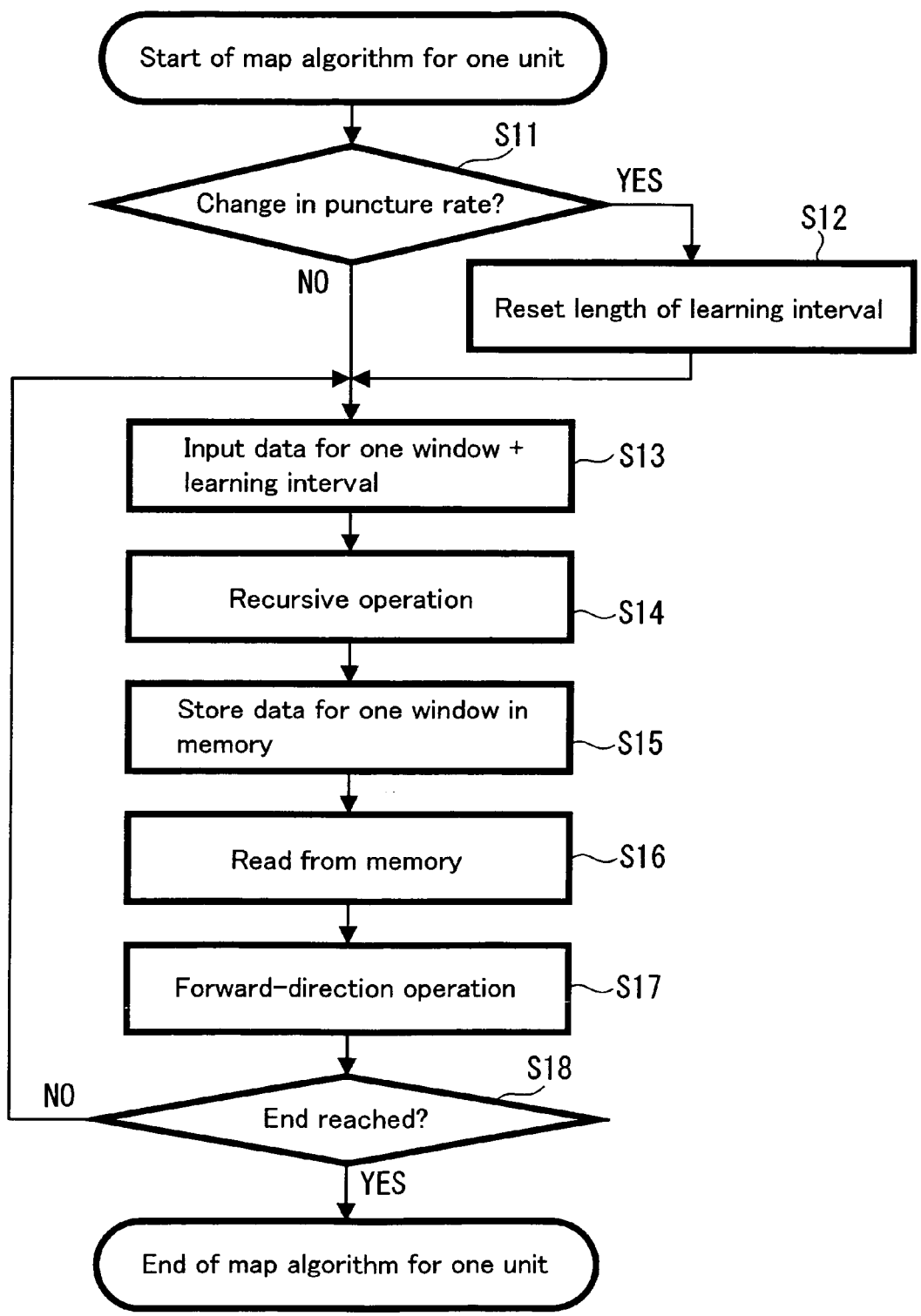
FIG. 5 is a flowchart showing an example of the processing of the MAP algorithm of an embodiment of the present invention.

FIG. 5 is a flowchart showing an example of processing to decode turbo-codes using the MAP algorithm according to the embodiment of this invention. As already explained, a turbo-code is a block code, and decoding of a turbo-code is performed in units of blocks (code blocks) including a fixed number of bits N. FIG. 5 is a flowchart showing the processing of one such block.

When processing of one block begins, the central control unit 7 judges whether the puncture rate has changed from the previous reception processing (step S11). If it is judged that the puncture rate has changed, the length of the learning interval is reset according to this puncture rate, and is stored in the central control unit 7 (step S12).

When in step S11 there is no change in the puncture rate, or when in step S12 the puncture rate has changed and resetting has been completed, [window length of one window]+[learning interval data] is input to the turbo-decoder 6 (step S13). The input data is then used to perform a recursive operation in the inverse direction (step S14) After the end of this recursive operation, the data of one window (that is, the data excluding the portion of the learning interval) is stored in memory provided with the MAP algorithm unit in the turbo-decoder 6 (step S15), the data stored in the memory is read (step S16), and forward-direction operations and output likelihood calculations are performed for the read-out data (step S17). When processing up to this point ends, a judgment is made as to whether processing has been performed up to the end of the data of one block (step S18), and if the end has not been reached, processing returns to step S13.

When the end is judged to have been reached, processing for one block ends.

FIG. 6 shows an example of the processing procedure for the MAP algorithm using a sliding window according to the embodiment of this invention. As shown in (a) of FIG. 6, the decoding trellis is continuous from the beginning to the end of the data for one block. Here, as the processing in the first procedure 1 an inverse-direction recursive operation is performed, as shown in (b) of FIG. 6, from the position resulting by adding to the data length L of one window which is a predetermined fixed length the length of the learning interval which length is set variably according to the puncture rate; and as the result of this operation, as shown in (c) of FIG. 6, the data of one window is stored in memory. Next, as the second procedure 2, the data stored in memory is read, as shown in (d) of FIG. 6; then, as indicated in (e) of FIG. 6, the read-out data is used to perform forward-direction operations, and in addition output likelihood calculations are performed. Up to this point, the processing is of one block.

As the processing of the next block, the readout position is slid by a length equivalent to one window, and as indicated in (f) of FIG. 6, as the third procedure 3, a inverse-direction recursive operation starting from the position obtained by adding to the data length L of one window by the length of the variably-set learning interval is performed, and as the operation result, the data of one window is stored in memory, as indicated in (g) of FIG. 6. Next, as the fourth procedure 4, as shown in (H) of FIG. 6, the data stored in memory is read, and as shown in (i) of FIG. 6, the read-out data is used to perform a forward-direction operation, to calculate the output likelihood.

Subsequently, decoding by means of the MAP algorithm is similarly executed for each window, while performing sliding. When processing the final window of one block, a inverse-direction recursive operation is performed using the data of the final window (that is, in a state of having no learning interval), as shown in (n) of FIG. 6, the data is stored in memory ((o) in FIG. 6), memory reading is performed ((p) in FIG. 6), the forward-direction operation is performed ((q) in FIG. 6), and all processing within one block is ended.

By thus performing decoding of the turbo-code, there is the advantageous result that turbo-decoding using a sliding window can be performed, while always optimally setting the length of the learning interval. That is, when the puncture rate, which is the rate of decimation of data on the transmission side, is variable, the positions and lengths for insertion of 0 bits are variably set in the deinterleave and depuncture unit 5 within the reception device of this embodiment, and the depunctured reception data is restored to the original data length. Further, by changing the length of the learning interval by a length equivalent to the number of bits decimated at the puncture rate, the number of bits of valid data contained in the learning interval is held constant even when the puncture rate changes, so that inverse-direction recursive operation processing is always performed using a constant amount of valid data, and decoding can be performed with constant performance.

Further, by always setting the length of the learning interval appropriately, there is no longer a need to set the length of the learning interval longer than necessary to ensure performance, as is the case in the prior art when the length of the learning interval is fixed, so that the amount of operation processing by the turbo-decoder can he held to a minimum. In addition, because there is no need to perform wasteful operations, the processing speed of decoding can be increased, and power consumption necessary for operation processing can be reduced.

The series of processing explained above can be realized in hardware, however can also be realized in software. When the series of processing is realized in software, a program including this software is installed in a computer device or other data processing devices, and by using the computer device or similar to execute the program, the functions of the above-described reception device are obtained.

Further, in the above embodiment, it was described that when the length of the learning interval is variably set, the number of bits decimated at the puncture rate and the number of bits by which the learning interval length is changed are made to coincide substantially perfectly; however, the amount of data decimated in puncture processing and the amount of the variable learning interval length setting may be made to change with a certain degree of correspondence. In such a case also, if there is some degree of margin in the length of the learning interval, the effect on the decoding accuracy is not considerably great.

The invention claimed is:

1. A data reception method for receiving and decoding turbo-encoded data that is encoded in units of blocks including a predetermined number of bits by a combination of convolutional encoding and interleaving and that is decimated as necessary at a predetermined puncture rate to be transmitted, comprising:

processing received data to judge the puncture rate;

interpolation processing to interpolate decimated bits at said puncture rate;

deinterleave processing to restore said interleaved data to an original arrangement; and turbo-decoding processing of data subjected to said interpolation processing and to said deinterleave processing, in which, while variably setting the length of a learning interval according to the judged puncture rate, the data of a sliding window and the data of said learning interval following the data of the sliding window are input to decode the data of the sliding window by recursive operations.

2. The data reception method according to claim 1, wherein the learning interval length which is variably set according to said puncture rate is changed by a length equivalent to the number of bits decimated at the puncture rate judged in processing for judging said puncture rate.

3. A data reception device that receives interleaved turbo-code encoded data in units of blocks including a predetermined number of bits, comprising:

puncture rate judgment means for detecting the puncture rate of said received data;

interpolation means for interpolating bits decimated at said detected puncture rate;

deinterleaving means for restoring said interleaved data to an original arrangement; and turbo-decoding means, having a learning interval variably set according to the detected puncture rate and having data of a sliding window input thereto, wherein data of said learning interval follows the data of the sliding window, said turbo-decoding means operating on the data from the interpolation means and deinterleaving means decode the data of the sliding window by recursive operations.

4. The data reception device according to claim 3, wherein the learning interval length which is variably set according to the puncture rate in said turbo-decoding means is changed by a length equivalent to the number of bits decimated at the puncture rate judged by said puncture rate judgment means.

* * * * *